United States Patent
Feng et al.

(10) Patent No.: US 9,961,772 B2
(45) Date of Patent: May 1, 2018

(54) INTEGRATED POWER ELECTRONICS ASSEMBLY MODULE

(71) Applicant: DELTA ELECTRONICS, INC., Taoyuan (TW)

(72) Inventors: Wei-Yi Feng, Taoyuan (TW); Wei-Qiang Zhang, Taoyuan (TW); Hong-Yang Wu, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 24 days.

(21) Appl. No.: 15/071,194

(22) Filed: Mar. 15, 2016

(65) Prior Publication Data

US 2016/0278211 A1    Sep. 22, 2016

(30) Foreign Application Priority Data

Mar. 18, 2015 (CN) .......................... 2015 1 0119016

(51) Int. Cl.
| | |
|---|---|
| *H05K 1/14* | (2006.01) |
| *H05K 9/00* | (2006.01) |
| *H05K 1/02* | (2006.01) |
| *H02M 1/34* | (2007.01) |
| *H05K 7/14* | (2006.01) |
| *H05K 7/20* | (2006.01) |
| *H02M 7/487* | (2007.01) |

(52) U.S. Cl.
CPC .............. *H05K 1/144* (2013.01); *H02M 1/34* (2013.01); *H05K 1/0203* (2013.01); *H05K 1/141* (2013.01); *H05K 7/1432* (2013.01); *H05K 7/20* (2013.01); *H05K 9/0007* (2013.01); *H02M 7/487* (2013.01)

(58) Field of Classification Search
CPC ...... H05K 1/141–1/145; H05K 1/0203; H05K 9/0007; H05K 7/20; H05K 7/1432; H02M 1/34; H02M 7/487
See application file for complete search history.

(56) References Cited

U.S. PATENT DOCUMENTS

| | | | |
|---|---|---|---|
| 5,774,353 A | 6/1998 | Wieloch | |
| 6,762,937 B2 * | 7/2004 | Kimoto | ................. H02M 7/003 165/185 |
| 2003/0063442 A1 | 4/2003 | Kimoto et al. | |
| 2008/0112201 A1 * | 5/2008 | Yahata | ................. H02M 7/003 363/131 |

(Continued)

FOREIGN PATENT DOCUMENTS

| | | |
|---|---|---|
| CN | 201616760 U | 10/2010 |
| CN | 203851041 U | 9/2014 |

(Continued)

*Primary Examiner* — Hoa C Nguyen
(74) *Attorney, Agent, or Firm* — CKC & Partners Co., Ltd.

(57) ABSTRACT

An integrated power electronics assembly module includes a power unit and a clamping auxiliary circuit board. The power unit includes a power level circuit board and a shielding casing. The power level circuit board is contained in the shielding casing. The clamping auxiliary circuit board is disposed against the shielding casing and stacked with the power level circuit board to reduce a parasitic inductance generated by a commutation loop constituted by the power level circuit board and the clamping auxiliary circuit board. The clamping auxiliary circuit board is electrically coupled to the power level circuit board via the shielding casing.

11 Claims, 8 Drawing Sheets

(56) References Cited

U.S. PATENT DOCUMENTS

2009/0294195 A1 12/2009 Otsuka et al.
2011/0013364 A1 1/2011 Howes et al.

FOREIGN PATENT DOCUMENTS

| CN | 204131386 U | 1/2015 |
| EP | 0688092 A2 | 12/1995 |
| EP | 2328392 A2 | 6/2011 |
| JP | 2000152662 A | 5/2000 |
| WO | 2013081097 A1 | 6/2013 |

* cited by examiner

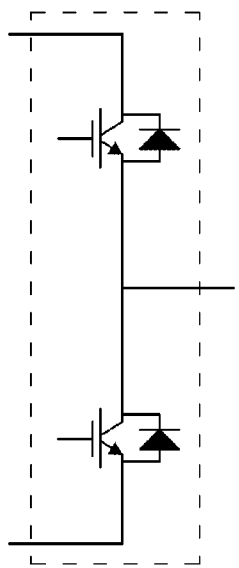
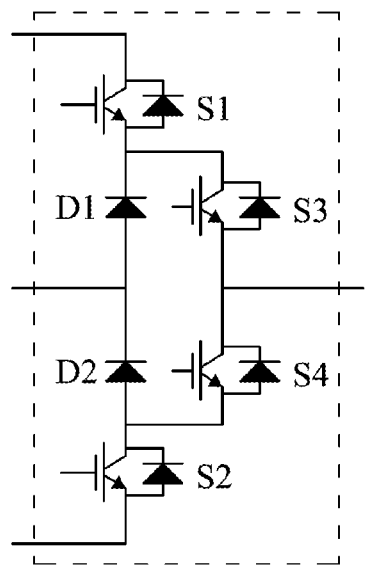
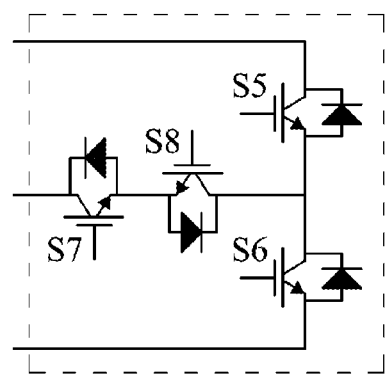
Fig. 2A        Fig. 2B        Fig. 2C
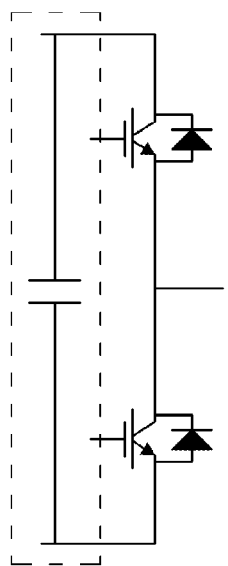
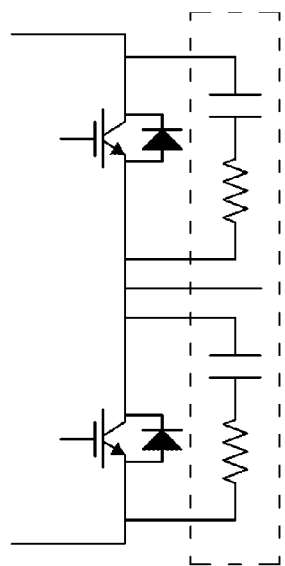
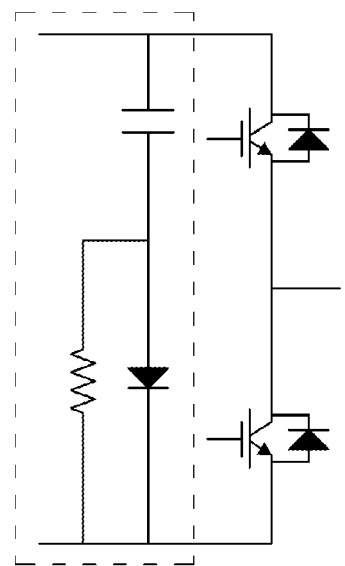
Fig. 3A        Fig. 3B        Fig. 3C

INTEGRATED POWER ELECTRONICS ASSEMBLY MODULE

RELATED APPLICATIONS

This application claims priority to Chinese Application Serial Number 201510119016.9, filed Mar. 18, 2015, which is herein incorporated by reference.

BACKGROUND

Field of Invention

The present application relates to a power supply conversion module. More particularly, the present application relates to an integrated power electronics assembly module.

Description of Related Art

Power electronic module is a module being able to convert electrical energy. The assemblies of a power conversion circuit and the applications of the power conversion circuit to electrical power conversion equipment with different specifications and requirements demand the power conversion circuit to have greater adaptability and flexibility. A power conversion circuit comprises a main power level circuit and a control circuit. The main power level circuit usually comprises switching devices and some passive devices. The passive device is usually an inductor, a capacitor, etc. The control circuit realizes the power conversion through controlling the on/off of the switching devices in the main power level circuit. Therefore, the design of the power conversion circuits is relatively focused on the application characteristics of the power conversion circuits themselves, and combined with other aided designs corresponding to the performance situations when the power conversion circuits are applied to systems so as to cooperate with other circuits of the systems to work properly.

With the development of system devices, the system devices are extensively used in a variety of operating environments and conditions. However, making the system devices simple, highly effective, and flexible is always a goal that the field intends to pursue. When the system device is simple, the design of the system device is also simplified to shorten the time required for designing the overall system device. However, the flexibility of the system device is more dependent on the design of the power conversion circuit. When the specificity of the power conversion circuit is strong, the power conversion circuit can only be applied to specific operating conditions to cause a poor portability of the power conversion circuit. Or, when the power conversion circuit is transplanted, it will directly affect other components or circuit design of the system device, which in turn may limit the application flexibility of the system device because of the specificity of the power conversion circuit itself.

SUMMARY

The present application provides an integrated power electronics assembly module configured to improve a portability of an integrated module and flexibility of a system device to which the integrated power electronics assembly module applies.

An integrated power electronics assembly module is provided. The integrated power electronics assembly module comprises a power unit and a clamping auxiliary circuit board. The power unit comprises a power level circuit board of a power conversion circuit and a shielding casing. The power level circuit board of the power conversion circuit is contained in the shielding casing. The clamping auxiliary circuit board is configured to reduce a parasitic inductance generated by a commutation loop constituted by the power level circuit board and the clamping auxiliary circuit board. The clamping auxiliary circuit board is stacked outside the shielding casing and electrically coupled to the power level circuit board via the shielding casing.

The integrated power electronics assembly module according to the present application is able to reduce the impact on the system board by the power electronics assembly module because the power unit and the clamping auxiliary circuit board are disposed in the vertically stacked manner. The portability of the power electronics assembly module is thus improved. In addition, the distance between the power unit and the clamping auxiliary circuit board can be shortened to effectively solve the problem that the switches in the power unit are damaged when being switched because of the voltage spikes.

It is to be understood that both the foregoing general description and the following detailed description are by examples, and are intended to provide further explanation of the application as claimed.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application. In the drawings.

FIG. 2A to FIG. 2C are circuit diagrams of a power level circuit board in an integrated power electronics assembly module according to various embodiments of this application;

FIG. 3A to FIG. 3C are circuit diagrams of a clamping auxiliary circuit board in an integrated power electronics assembly module according to various embodiments of this application;

DESCRIPTION OF THE EMBODIMENTS

Figure 1:
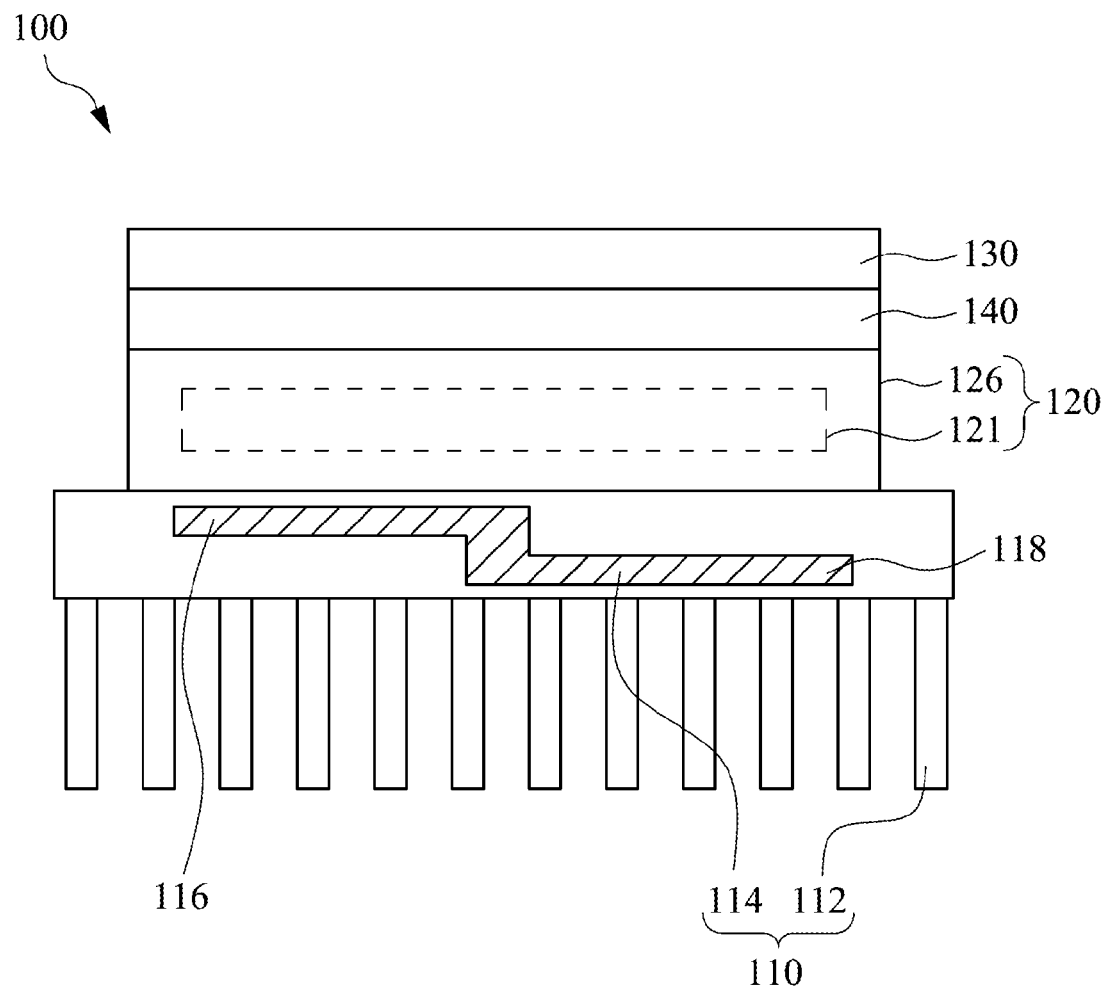
FIG. 1 is a side view of an integrated power electronics assembly module according to one embodiment of this application.

Reference will now be made in detail to the present embodiments of the application, examples of which are illustrated in the accompanying drawings. Wherever possible, the same reference numbers are used in the drawings and the description to refer to the same or like parts.

A description is provided with reference to FIG. 1. FIG. 1 is a side view of an integrated power electronics assembly module according to one embodiment of this application. An integrated power electronics assembly module 100 comprises a heat-sink base 110, a power unit 120, a control circuit board 130, and a clamping auxiliary circuit board 140. The power unit 120 comprises a power level circuit board 121 and a shielding casing 126. The shielding casing 126 is disposed on the heat-sink base 110. The power level circuit board 121 is contained in the shielding casing 126. The clamping auxiliary circuit board 140 is stacked outside the shielding casing 126 and is electrically coupled to the power level circuit board 121 via the shielding casing 126.

The power unit 120 has a plurality of switches in it, and the switch(es) in a commutation loop will switch to perform a current conversion operation. However, a parasitic inductance usually exists in the commutation loop. Therefore, during the transient period in which the switches switch, the parasitic inductance will result in a higher voltage that needs to be sustained by the switches. Even more, when the switches turn off, voltage spikes will be generated to affect the switches. For example, when an input voltage is 380V, the voltage spike is likely to reach to 600V, which is much higher than the rated voltage sustainable by the switches, during the transient period in which the switches turn off. The switches are thus damaged, which in turn causes that the integrated power electronics assembly module 100 cannot operate normally.

Therefore, the clamping auxiliary circuit board 140 is disposed as close as possible to the power unit 120 to reduce the parasitic inductance generated by the commutation loop constituted by the power level circuit board 121 and the clamping auxiliary circuit board 140 so as to inhibit the generation of voltage spikes. In order to allow the clamping auxiliary circuit board 140 to have a better protection effect and allow the integrated power electronics assembly module 100 to have a better portability so as to reduce the impact on a system board, the heat-sink base 110, the power unit 120, the control circuit board 130, and the clamping auxiliary circuit board 140 of the integrated power electronics assembly module 100 are stacked in a vertical manner.

In detail, the power unit 120 is disposed on the heat-sink base 110. The control circuit board 130 and the clamping auxiliary circuit board 140 are disposed on the power unit 120 in a stacked manner, and the clamping auxiliary circuit board 140 is located between the power unit 120 and the control circuit board 130. In addition, orthogonal projections of the power unit 120, the control circuit board 130, and the clamping auxiliary circuit board 140 onto the heat-sink base 110 at least partially overlap. The orthogonal projection of the clamping auxiliary circuit board 140 onto the heat-sink base 110 and the orthogonal projection of the power unit 120 onto the heat-sink base 110 overlap each other.

Hence, the integrated power electronics assembly module 100 is disposed in a vertically stacked manner, which allows a space of the system board occupied by the integrated power electronics assembly module 100 to be reduced and allows the clamping auxiliary circuit board 140 to be disposed against the power unit 120 so as to shorten a distance between the power level circuit board 121 and the clamping auxiliary circuit board 140. Therefore, the voltage spikes generated by switching devices in the power unit 120, such as metal-oxide-semiconductor field-effect transistors (MOSFETs), insulated gate bipolar transistors (IGBTs), diodes, etc., can be caught by the clamping auxiliary circuit board 140 electrically coupled to the power unit 120. The present embodiment may avoid the problem that the switching devices in the integrated power electronics assembly module 100 are damaged because of voltage spikes, so as to reduce the impact of the integrated power electronics assembly module 100 on the system board.

The heat-sink base 110 may be a water-cooled heat-sink base, an air-cooled heat-sink base, or a heat-sink base in both a water-cooled type and an air-cooled type. For example, the heat-sink base 110 comprises a fin assembly 112 and a pipe 114 penetrating through the fin assembly 112 according to the present embodiment. The pipe 114 has a hot end 116 and a cold end 118. The hot end 116 is close to the power unit 120 which serves as a heat end. The cold end 118 is close to the fin assembly 112 which serves as a heat dissipation end. As a result, the heat quantity generated by the power unit 120 is transmitted to the fin assembly 112 via the pipe 114 and is then dissipated. It is noted that although in the present embodiment the heat-sink base 110 comprising the fin assembly 112 and the pipe 114 is utilized for illustration, however, those of ordinary skill in the art may select an apparatus, such as a water-cooled heat exchanger, as required, and the present application is not limited in this regard.

The power level circuit board 121 at least comprises a switching circuit to constitute a bridge-rectifier circuit. The switching circuit comprises a plurality switching devices and diodes which are coupled. In practical applications, the switching device may comprise an insulated gate bipolar transistor (IGBT), a metal-oxide-semiconductor field-effect transistor (MOSFET), another type of transistor, or combinations thereof. The control circuit board 130 may comprise, for example, a driving circuit, a voltage source, a protective circuit, or a control device disposed on the control circuit board 130.

In order to solve the voltage spike problem generated during the transient period in which the switching devices switch, especially turn off, the clamping auxiliary circuit board 140 is vertically stacked on the power unit 120 to catch the voltage spikes so as to reduce the impact of the voltage spikes on the switching circuit of the power level circuit board 121. The clamping auxiliary circuit board 140 may comprise, for example, a voltage clamping circuit board, a snubber circuit, a decoupling circuit, or combinations thereof. As mentioned previously, by disposing the clamping auxiliary circuit board 140 and the power unit 120 in the vertically stacked manner, the clamping auxiliary circuit board 140 is more close to the power unit 120 to enhance the protective ability of the clamping auxiliary circuit board 140.

FIG. 2A to FIG. 2C are circuit diagrams of a power level circuit board in an integrated power electronics assembly module according to various embodiments of this application. For example, two switching devices coupled in series, such as insulated gate bipolar transistors (IGBTs), may be comprised to constitute a half-bridge converter, as shown in FIG. 2A. Or, as shown in FIG. 2B, a three-level diode-clamped neutral point converter (3-level DNPC) is comprised. Switches S1, S2 and diodes D1, D2 are all coupled in series. The switch S1 and the diode D1 are coupled at a first terminal. The switch S2 and the diode D2 are coupled at a second terminal. A branch circuit constituted by switches S3, S4 coupled in series is also coupled to the first terminal and the second terminal. Or, as shown in FIG. 2C, a three-level T-type neutral point converter (3-level TNPC) is comprised. Switches S5, S6 are coupled in series and are coupled at a third terminal. A branch circuit constituted by switches S7, S8 coupled in series is also coupled to the third terminal.

The circuit disclosed above only serves as an example and is not intended to limit the present application. The power unit 120 (see FIG. 1) may comprise combinations of insulated gate bipolar transistors, metal-oxide-semiconductor field-effect transistors, diodes, etc. The power unit 120 may be in a form of an integrated module, a plastic package, or a housing package.

FIG. 3A to FIG. 3C are circuit diagrams of a clamping auxiliary circuit board in an integrated power electronics assembly module according to various embodiments of this application. For example, a description is provided with reference to FIG. 2A. In FIG. 3A a decoupling circuit, that is a decoupling capacitor shown in FIG. 3A, is coupled in parallel with the half-bridge circuit provided in FIG. 2A to inhibit the voltage spikes generated by the two switching devices when the two switching devices are turned on/turned off so as to allow the charge path to be the same as the discharge path of the clamping auxiliary circuit. Or, as shown in FIG. 3B, an RC snubber circuit constituted by a capacitor and a resistor is coupled in parallel with each of the switching devices of the half-bridge circuit, and the charge path is similarly the same as the discharge path of the clamping auxiliary circuit. Or, as shown in FIG. 3C, a voltage clamping circuit constituted by a resistor, a capacitor, and a diode is coupled in parallel with the half-bridge circuit. The voltage clamping circuit similarly provides the effect of catching voltage spikes. However, the charge path (comprises the capacitor and the diode coupled in series) of the voltage clamping circuit is different from the discharge path (comprises the capacitor and the resistor).

Figure 4:
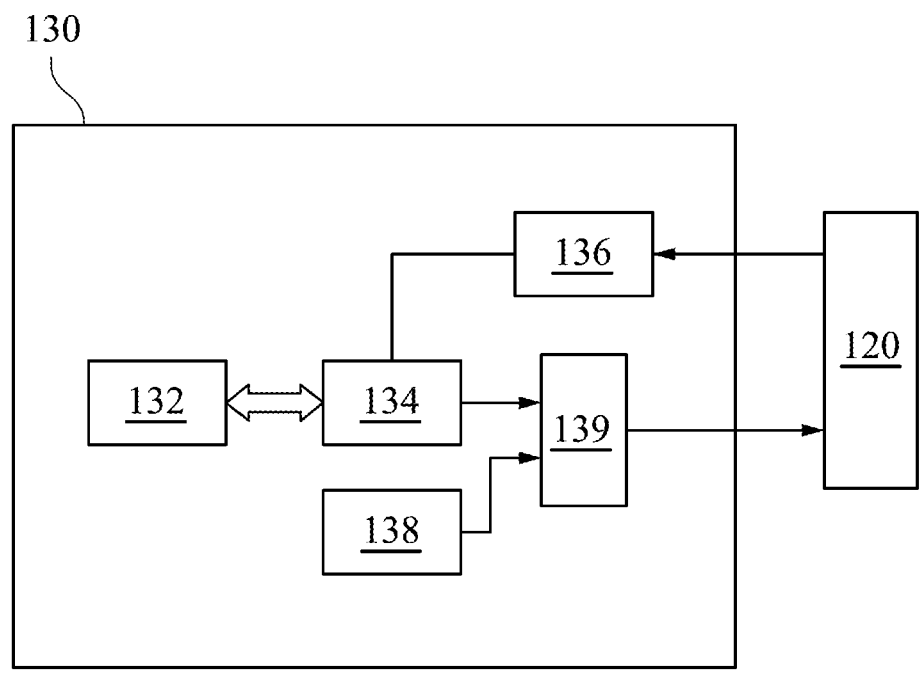
FIG. 4 is a circuit block diagram of a control circuit board in an integrated power electronics assembly module according to one embodiment of this application.

A description is provided with reference to FIG. 4. FIG. 4 is a circuit block diagram of a control circuit board in an integrated power electronics assembly module according to one embodiment of this application. The control circuit board 130 comprises a control chip 132, an isolating circuit 134, a protective circuit 136, an isolating source 138, and a driving circuit 139 on the control circuit board 130. The control chip 132 is coupled to the power unit 120 via the isolating circuit 134 and the driving circuit 139. The isolating source 138 and the driving circuit 139 on the control circuit board 130 are coupled. The protective circuit 136 is coupled to the isolating circuit 134 and the power unit 120.

Figure 5:
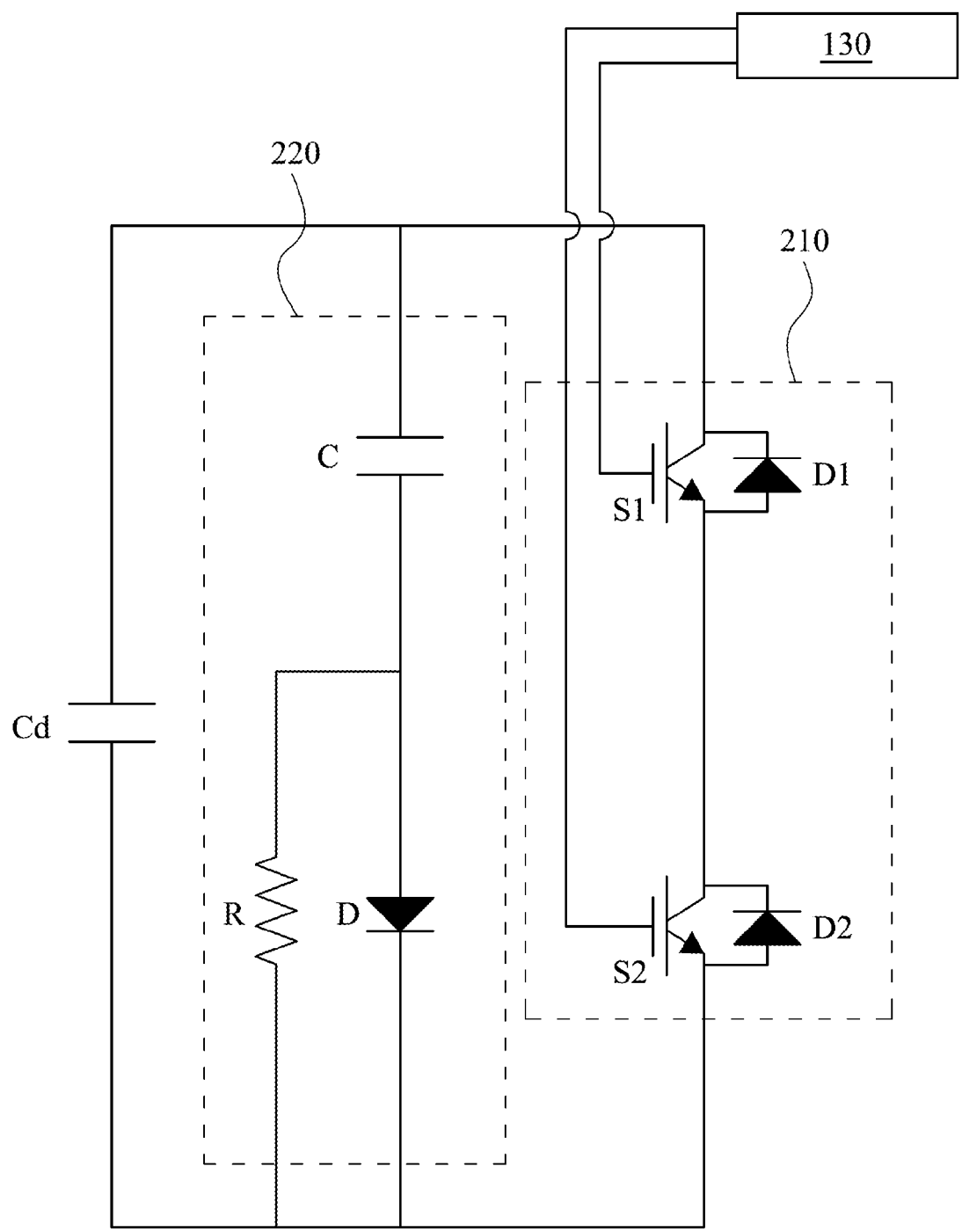
FIG. 5 to FIG. 7 respectively are circuit schematic diagrams of an integrated power electronics assembly module according to various embodiments of this application.
Figure 6:
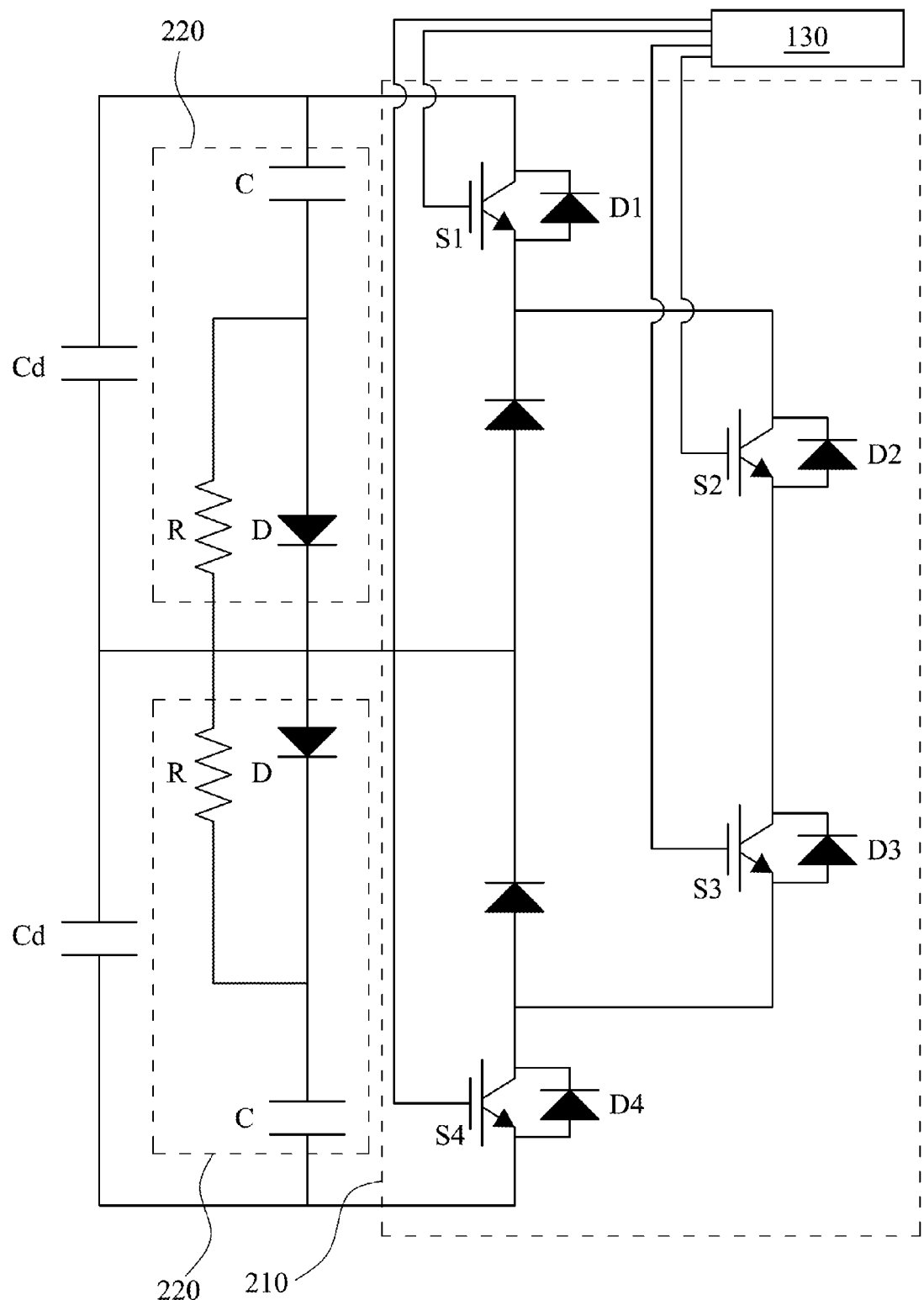
Figure 7:
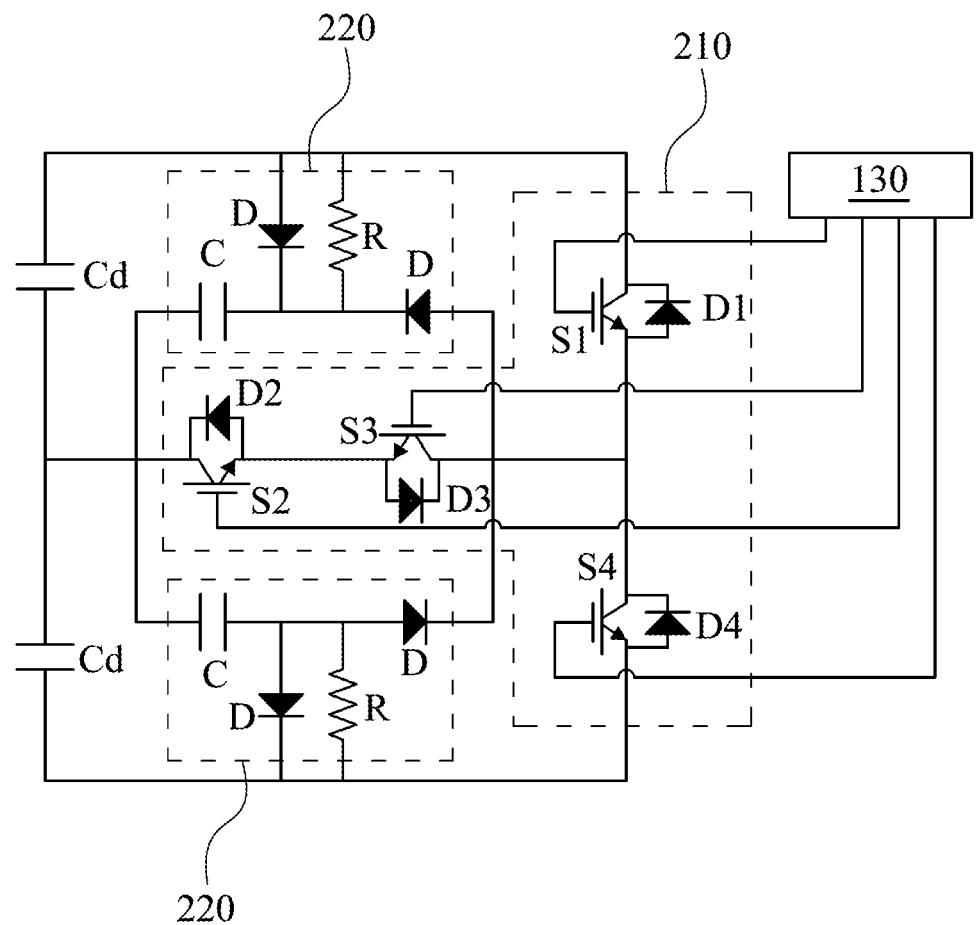

FIG. 5 to FIG. 7 respectively are circuit schematic diagrams of an integrated power electronics assembly module according to various embodiments of this application. A circuit schematic diagram of an integrated power electronics assembly module integrated with a half-bridge converter is shown in FIG. 5. The integrated power electronics assembly module comprises a half-bridge power circuit 210 (located on the above power level circuit board 121) constituted by two switching devices S1, S2 and two diodes D1, D2, a voltage clamping circuit 220 (located on the above clamping auxiliary circuit board 140) constituted by a capacitor C, a diode D, and a resistor R, and a decoupling capacitor Cd. The switching devices S1, S2 are coupled to the driving circuit 139 (see FIG. 4) of the control circuit board 130.

A circuit schematic diagram of an integrated power electronics assembly module integrated with a diode-clamped neutral point converter (DNPC) is shown in FIG. 6. The integrated power electronics assembly module comprises a three-level diode-clamped neutral point converter power circuit 210 (located on the above power level circuit board 121) constituted by four switching devices S1, S2, S3, S4 and four diodes D1, D2, D3, D4, the two voltage clamping circuits 220 (located on the above clamping auxiliary circuit board 140) which is constituted by a capacitor C, a diode D, and a resistor R, and decoupling capacitors Cd. The switching devices S1, S2, S3, S4 are coupled to the driving circuit 139 (see FIG. 4) of the control circuit board 130.

A circuit schematic diagram of an integrated power electronics assembly module integrated with a T-type neutral point converter (TNPC) is shown in FIG. 7. The integrated power electronics assembly module comprises a three-level T-type neutral point converter power circuit 210 (located on the above power level circuit board 121) constituted by four switching devices S1, S2, S3, S4 and four diodes D1, D2, D3, D4, two voltage clamping circuits 220 (located on the above clamping auxiliary circuit board 140) which is constituted by a capacitor C, a diode D, and a resistor R, and decoupling capacitors Cd. The switching devices S1, S2, S3, S4 are coupled to the driving circuit 139 (see FIG. 4) of the control circuit board 130.

Several embodiments of the power unit and the embodiments of the clamping auxiliary circuit corresponding to the several embodiments of the power unit are described above. However, since there are many different types of the power level circuit of the power unit for those of ordinary skill in the art, the power unit is not limited to the above embodiments, and the clamping auxiliary circuit is not limited to the clamping auxiliary circuits as described. As long as the clamping auxiliary circuit is able to form a commutation loop during operation, the clamping auxiliary circuit should be fabricated to be a circuit board independent of the power level circuit board and should be disposed as close as possible to the power level circuit board in a stacked manner.

Figure 8:
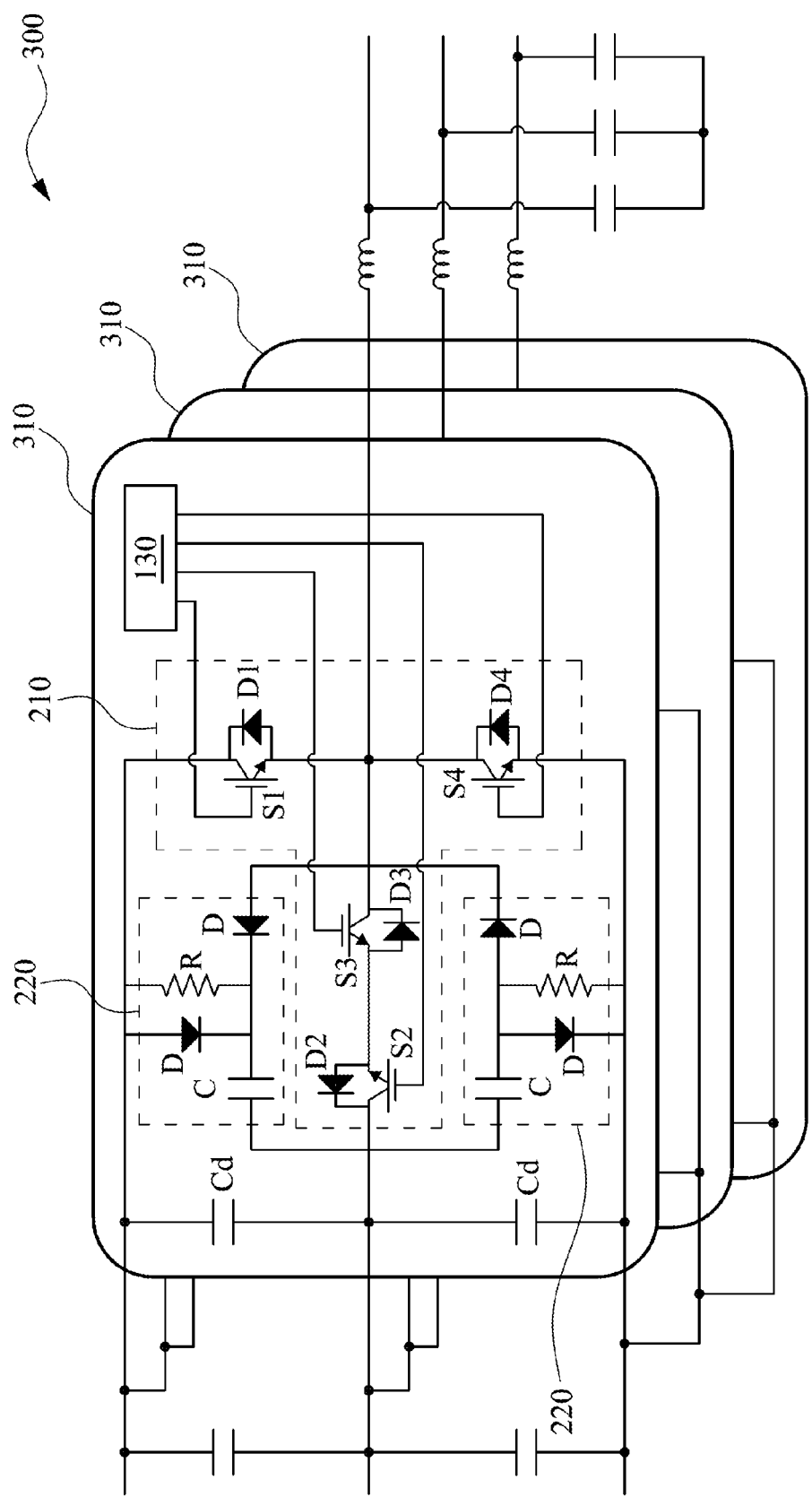
FIG. 8 is a circuit schematic diagram of a transformer utilizing the present application integrated power electronics assembly module.

Not only can the integrated power electronics assembly module be used by itself, but a plurality of integrated power electronics assembly modules can also be combined together. FIG. 8 is a circuit schematic diagram of a transformer utilizing the present application integrated power electronics assembly module. As shown in FIG. 8, a bidirectional DC/AC transformer 300 is composed of three integrated power electronics assembly modules 310 integrated with the T-type neutral point converters (TNPC). Details of the integrated power electronics assembly module 310 integrated with the T-type neutral point converter have been described in FIG. 7.

Figure 9:
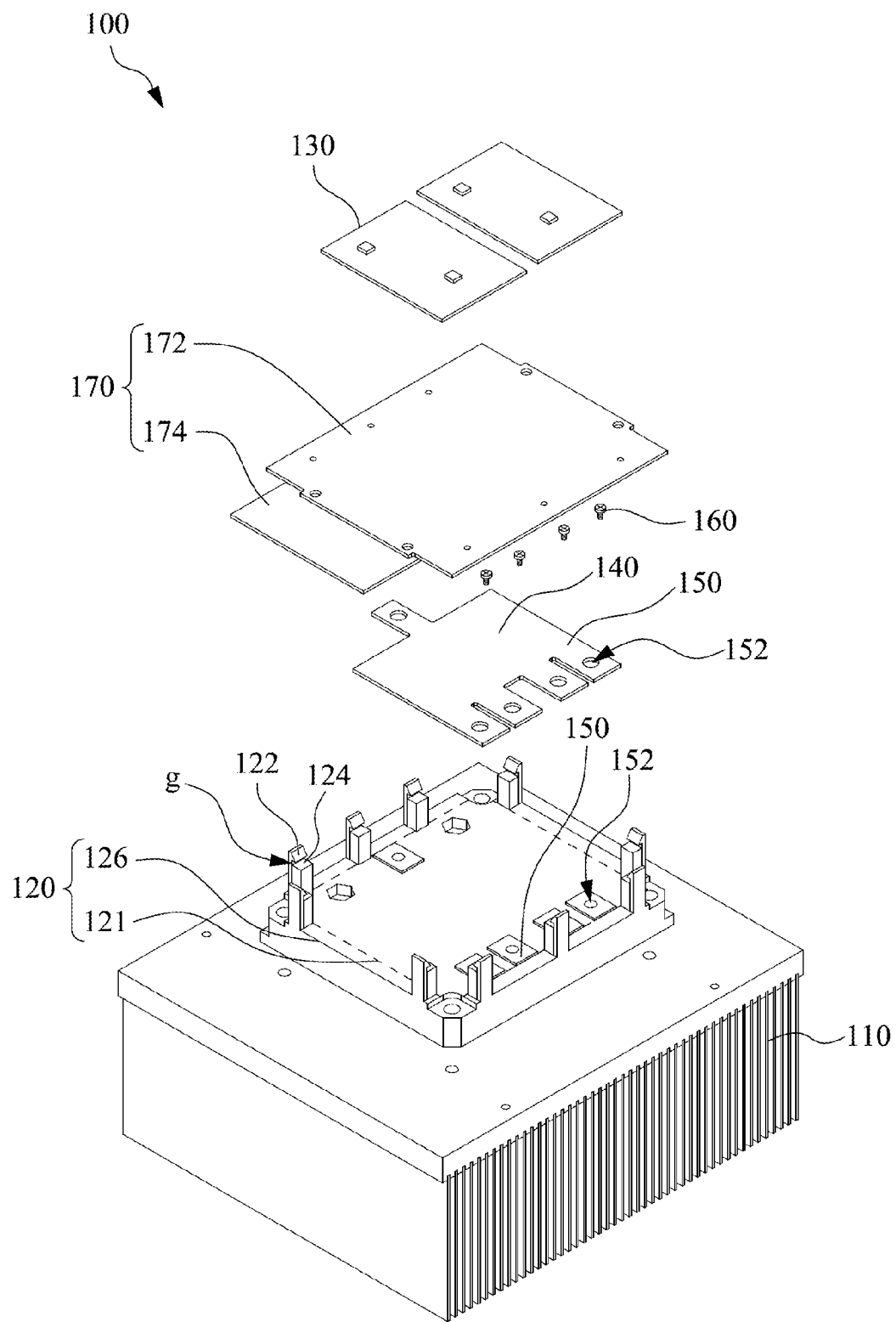
FIG. 9 is an exploded view of an integrated power electronics assembly module according to another embodiment of this application.

A description is provided with reference to FIG. 9. FIG. 9 is an exploded view of an integrated power electronics assembly module according to another embodiment of this application. The integrated power electronics assembly module 100 comprises the heat-sink base 110, the power unit 120, the clamping auxiliary circuit board 140, and the control circuit board 130 sequentially stacked from bottom to top. Since a detailed description of the heat-sink base 110, the power unit 120, the clamping auxiliary circuit board 140, and the control circuit board 130 has been provided in the above embodiments, connection relationships therebetween and a fixing method will be provided in the present embodiment in detail.

The power unit 120 may be assembled to the heat-sink base 110 through various methods, such as adhering, engaging, screw tightening, welding, etc. The power unit 120 comprises the shielding casing 126 and the power level circuit board 121 contained in the shielding casing 126. Each of the shielding casing 126 of the power unit 120 and the clamping auxiliary circuit board 140 comprises a plurality of contact pads 150. A material of the contact pad 150 is a conductor. The contact pads 150 on the power unit 120 are respectively coupled to positions of the power level circuit board 121 correspondingly. The contact pads 150 on the clamping auxiliary circuit board 140 are respectively coupled to electric circuits correspondingly. Holes 152 are formed in the contact pads 150. The integrated power electronics assembly module 100 further comprises a plurality of screws 160. The screws 160 penetrate through the holes 152 and contact the contact pads 150 so as to perform screw tightening and electrically connect the clamping auxiliary circuit board 140 and the power unit 120 through the shielding casing 126.

Since the clamping auxiliary circuit board 140 lies flat on the power unit 120 and closely contacts the power unit 120, the distance between the power level circuit board 121 and the clamping auxiliary circuit board 140 is shortened to reduce the parasitic inductance between them and inhibit the generation of the voltage spikes in the commutation loop constituted by the power level circuit board 121 and the clamping auxiliary circuit board 140.

The integrated power electronics assembly module 100 further comprises an adapter mask 170 for adapting the control circuit board 130 and providing electrostatic protection. In detail, the adapter mask 170 comprises an adapter plate 172 and a mask layer 174 underneath the adapter plate 172. The adapter mask 170 is disposed between the control circuit board 130 and the clamping auxiliary circuit board 140. The adapter mask 170 is configured to carry the control circuit board 130, and a shape of the adapter mask 170 matches with that of the shielding casing 126.

In detail, a plurality of hooks 122 and elastic members 124 are disposed on the shielding casing 126 of the power unit 120. The hooks 122 and the elastic members 124 are disposed on a surface away from the heat-sink base 110 and extend along a direction away from the heat-sink base 110. An accommodation space g is formed between the hooks 122 and the elastic members 124. The adapter mask 170 is held between the hooks 122 and the elastic members 124. The control circuit board 130 may be positioned on the adapter mask 170 by, for example, plugging. A driving circuit and a protective circuit may be disposed on the adapter plate 172. A material of the shielding casing 126 and the elastic member 124 may be a conductor to allow the control circuit board 130 to be electrically coupled to the power level circuit board 121 via the elastic members 124 and the shielding casing 126.

A material of the mask layer 174 is a conductor. The mask layer 174 may be an independent metal plate disposed between the adapter plate 172 and the clamping auxiliary circuit board 140, or a copper layer disposed on a surface of the adapter plate 172 facing the clamping auxiliary circuit board 140. The mask layer 174 can prevent electromagnetic interference (EMI) and impacts on the control circuit because of the power unit 120.

In other embodiments, the control circuit board does not need the adapter mask, and the control circuit board itself can serve as a support board to mount the control chip, the driving circuit, and the protective circuit and matches with the shielding casing of the power unit so that the control circuit board can be directly installed on the shielding casing and stacked on the clamping auxiliary circuit board. When considering the electromagnetic interference (EMI) and impacts on the control circuit because of the power unit 120, the shielding layer, such as a copper layer, may be formed on a surface of the control circuit board facing the clamping auxiliary circuit board.

In summary, by stacking the heat-sink base 110, the power unit 120, the clamping auxiliary circuit board 140, and the control circuit board 130 in the vertical manner, a path length between the power unit 120 and the clamping auxiliary circuit board 140 can be minimized to reduce the generation of parasitic inductance and voltage spikes.

It should be understood from the above embodiments that the present application integrated power electronics assembly module is disposed in the vertically stacked manner to save the area of the system board occupied by the power conversion circuit. In addition, the distance between the power level circuit board and the clamping auxiliary circuit board can be shortened to effectively solve the problem that the switches in the power unit are damaged when being switched because of the voltage spikes. The clamping auxiliary circuit board is fabricated as an independent circuit board to be directly assembled with the power unit. In this manner, when the power unit is changed, the clamping auxiliary circuit board can be replaced timely to match with the power unit. There is no necessity to change the design of the system board to improve the design flexibility of the integrated power electronics assembly module, which in turn simplifies the design of the system board. A plurality of power electronics assembly modules can be coupled in parallel as required by the system board. The power electronics assembly module having a stable performance adapts to different specifications of the system boards, which in turn has a better portability and simplifies the design of the system board to a greater degree.

Although the present application has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present application without departing from the scope or spirit of the application. In view of the foregoing, it is intended that the present application cover modifications and variations of this application provided they fall within the scope of the following claims and their equivalents.

What is claimed is:

1. An integrated power electronics assembly module mounted on a system board comprising:
   a power unit comprising a power level circuit board and a shielding casing, the power level circuit board being contained in the shielding casing;
   a clamping auxiliary circuit board configured to stack outside the shielding casing and electrically couple to the power level circuit board via the shielding casing, so as to reduce a parasitic inductance generated by a commutation loop constituted by the power level circuit board and the clamping auxiliary circuit board,
   a plurality of hooks and a plurality of elastic members disposed on the shielding casing, wherein an accommodation space is formed between the elastic members and the hooks; and
   an adapter mask fixed in the accommodation space.

2. The integrated power electronics assembly module of claim 1, further comprising a control circuit board configured to stack on the clamping auxiliary circuit board and electrically couple to the power level circuit board via the shielding casing, so as to control the power level circuit board.

3. The integrated power electronics assembly module of claim 2, wherein the adapter mask is disposed between the control circuit board and the clamping auxiliary circuit board, the adapter mask carries the control circuit board, and a shape of the adapter mask matches with a shape of the shielding casing.

4. The integrated power electronics assembly module of claim 3, wherein the adapter mask comprises an adapter plate and a mask layer, the mask layer is located between the adapter plate and the clamping auxiliary circuit board.

5. The integrated power electronics assembly module of claim 4, wherein a control driving circuit and a protective circuit are disposed on the adapter plate.

6. The integrated power electronics assembly module of claim 4, wherein the mask layer is a metal plate.

7. The integrated power electronics assembly module of claim 4, wherein the mask layer is a copper layer disposed on a surface of the adapter plate.

8. The integrated power electronics assembly module of claim 1, further comprising a heat-sink base, the power unit being disposed on the heat-sink base, the heat-sink base comprising a fin assembly and a pipe penetrating through the fin assembly.

9. The integrated power electronics assembly module of claim 8, wherein an orthogonal projection of the power unit onto the heat-sink base overlaps with an orthogonal projection of the clamping auxiliary circuit board onto the heat-sink base.

10. The integrated power electronics assembly module of claim 1, wherein the power level circuit board comprises a half-bridge converter, a diode-clamped neutral point converter, or a T-type neutral point converter.

11. The integrated power electronics assembly module of claim 1, wherein the clamping auxiliary circuit board comprises at least one selected from the combination of a voltage clamping circuit, a decoupling circuit, and a snubber circuit.

* * * * *